(12) United States Patent
Hirai

(10) Patent No.: US 8,242,501 B2
(45) Date of Patent: Aug. 14, 2012

(54) THIN FILM TRANSISTOR AND ELECTRONIC APPARATUS

(75) Inventor: Nobukazu Hirai, Kanagawa (JP)

(73) Assignee: Sony Corporation, Tokyo (JP)

( * ) Notice: Subject to any disclaimer, the term of this patent is extended or adjusted under 35 U.S.C. 154(b) by 185 days.

(21) Appl. No.: 12/571,637

(22) Filed: Oct. 1, 2009

(65) Prior Publication Data

US 2010/0084643 A1    Apr. 8, 2010

(30) Foreign Application Priority Data

Oct. 3, 2008  (JP) .................................. 2008-258044

(51) Int. Cl.
| | | |
|---|---|---|
| H01L 29/04 | (2006.01) | |
| H01L 29/10 | (2006.01) | |
| H01L 31/036 | (2006.01) | |
| H01L 31/0376 | (2006.01) | |
| H01L 31/20 | (2006.01) | |
| H01L 29/76 | (2006.01) | |
| H01L 31/112 | (2006.01) | |
| H01L 27/108 | (2006.01) | |
| H01L 29/12 | (2006.01) | |
| H01L 29/08 | (2006.01) | |
| H01L 35/24 | (2006.01) | |
| H01L 51/00 | (2006.01) | |

(52) U.S. Cl. ................. 257/57; 257/40; 257/66; 257/69; 257/E29.151

(58) Field of Classification Search .................... 257/40, 257/57, 66, 69, E29.151
See application file for complete search history.

(56) References Cited

U.S. PATENT DOCUMENTS

| | | | | |
|---|---|---|---|---|
| 5,580,796 | A * | 12/1996 | Takizawa et al. | ............. 438/158 |
| 5,610,738 | A * | 3/1997 | Sasano et al. | .................... 349/43 |
| 5,731,856 | A * | 3/1998 | Kim et al. | ........................ 349/43 |
| 5,821,133 | A * | 10/1998 | Kawai et al. | ..................... 438/30 |
| 5,953,084 | A * | 9/1999 | Shimada et al. | ................ 349/38 |
| 7,170,571 | B2 * | 1/2007 | Chae | ................................ 349/47 |
| 7,259,037 | B2 * | 8/2007 | Shih | ................................ 438/55 |
| 7,283,182 | B2 * | 10/2007 | Sato | ................................ 349/44 |
| 7,638,774 | B2 * | 12/2009 | Choo et al. | .............. 250/370.09 |
| 7,655,566 | B2 * | 2/2010 | Fujii | ............................ 438/678 |
| 7,709,834 | B2 * | 5/2010 | Cho et al. | ........................ 257/40 |
| 7,825,472 | B2 * | 11/2010 | Park et al. | ..................... 257/351 |
| 7,919,365 | B2 * | 4/2011 | Kim et al. | ..................... 438/149 |

(Continued)

FOREIGN PATENT DOCUMENTS

EP    1638142 A2 *    3/2006
(Continued)

OTHER PUBLICATIONS

Japanese Office Action issued on Oct. 12, 2010, for corresponding Japanese Patent Application JP-2008-258044.

*Primary Examiner* — Ida M Soward
(74) *Attorney, Agent, or Firm* — K&L Gates LLP

(57) ABSTRACT

A thin film transistor includes an insulating layer formed from an organic material, an oxide material, or a silicon based material, a source electrode and a drain electrode disposed on the insulating layer by using an electrically conductive oxide material, a self-organized film covering exposed surfaces of the insulating layer, the source electrode, and the drain electrode, and a semiconductor thin film disposed, on the insulating layer provided with the self-organized film, over from the source electrode to the drain electrode.

6 Claims, 6 Drawing Sheets

U.S. PATENT DOCUMENTS

| | | |
|---|---|---|
| 7,956,433 B2 * | 6/2011 | Okada et al. ............... 257/440 |
| 7,977,679 B2 * | 7/2011 | Cho .............................. 257/72 |
| 2004/0004224 A1 * | 1/2004 | Han ............................... 257/88 |
| 2004/0135943 A1 * | 7/2004 | Kang et al. ................. 349/113 |
| 2004/0238823 A1 * | 12/2004 | Lee et al. ..................... 257/72 |
| 2005/0030454 A1 * | 2/2005 | Jang et al. .................. 349/114 |
| 2005/0242350 A1 * | 11/2005 | Bae et al. ...................... 257/59 |
| 2005/0243235 A1 * | 11/2005 | Lee ............................... 349/44 |
| 2007/0170431 A1 * | 7/2007 | Choi et al. .................... 257/66 |
| 2008/0309866 A1 * | 12/2008 | Huang et al. ............... 349/153 |
| 2009/0001353 A1 * | 1/2009 | Shukla et al. ................. 257/40 |

FOREIGN PATENT DOCUMENTS

| | | |
|---|---|---|
| JP | 2005-503026 | 1/2005 |
| JP | 2005-327797 | 11/2005 |
| JP | 2006-179703 | 7/2006 |

* cited by examiner

THIN FILM TRANSISTOR AND ELECTRONIC APPARATUS

CROSS REFERENCES TO RELATED APPLICATIONS

The present application claims priority to Japanese Priority Patent Application JP 2008-258044 filed in the Japan Patent Office on Oct. 3, 2008, the entire content of which is hereby incorporated by reference.

BACKGROUND

The present application relates to a thin film transistor, a method for manufacturing a thin film transistor, and an electronic apparatus. In particular, the present application relates to a bottom contact type thin film transistor, in which a semiconductor thin film is disposed as a layer on a source electrode and a drain electrode, a method for manufacturing the thin film transistor, and furthermore, an electronic apparatus including the thin film transistor.

In recent years, a thin film transistor (TFT) including an organic semiconductor thin film serving as an active layer, that is, a so-called organic thin film transistor (hereafter abbreviated as organic TFT) has been noted. The organic TFT is advantageous for cost reduction because the organic semiconductor thin film serving as an active film can be formed through coating film formation at low temperatures. Furthermore, formation on a flexible substrate, e.g., plastic, having low heat resistance is possible. Therefore, the organic TFT has been noted as a drive element of a thin film display device as well.

Regarding such an organic TFT, it has been understood that the film quality of the organic semiconductor thin film serving as an active layer depends on properties of a base material surface significantly. Consequently, in production of the organic TFT, in order to improve the device characteristics, it has been attempted to form an organic semiconductor thin film having good quality by devising the material for a base material itself or reforming the base material surface before formation of the organic semiconductor thin film.

For example, a material suitable for a substrate or a gate insulating film, which serve as a base material of the organic semiconductor thin film, is selected from wide variety of materials from inorganic compounds to organic polymer compounds and is used, so that growth of the organic semiconductor thin film on the substrate or the gate insulating film is facilitated. On the other hand, the materials selected for the source electrode and the drain electrode are limited from the viewpoint of the electrical conductivity and the like. Consequently, growth of the organic semiconductor thin film on the source electrode and the drain electrode is facilitated by subjecting these electrodes to a surface treatment with, for example, a thiol molecule.

Besides, "IEEE ELECTRON DEVICE LETTERS", VOL. 18, NO. 12, p. 606-608, 1997 discloses that a source electrode and a drain electrode are formed from gold (Au) on a gate insulating film formed from silicon oxide ($SiO_2$) and, thereafter, a treatment by using an ethanol solution of octadecyltrichlorosilane (OTS) is conducted, so as to form a unimolecular film on $SiO_2$ through self organization and reform the surface of the gate insulating film serving as a base material of an organic semiconductor thin film.

Furthermore, for example, Japanese Unexamined Patent Application Publication (Translation of PCT Application) No. 2005-503026 discloses a method in which in disposition of a self-organized unimolecular layer to reform a base material of the organic semiconductor thin film on a surface of a gate insulating film serving as a base material for an organic semiconductor thin film, this self-organized unimolecular layer is formed as a reaction product of the gate insulating film and a precursor of the self-organized unimolecular layer.

SUMMARY

Incidentally, regarding production of a bottom contact type organic TFT, it is desirable that an organic semiconductor thin film is formed on a surface on which a substrate, a source electrode, and a drain electrode are present together or a surface on which a gate insulating film, a source electrode, and a drain electrode are present together.

However, in the above-described method in which the materials for the substrate and the gate insulating film are selected appropriately and the source electrode and the drain electrode formed thereon are subjected to the surface treatment with the thiol molecule, the substrate and the gate insulating film are damaged in the surface treatment process. Consequently, the favorable growth of the organic semiconductor thin film on the substrate and the gate insulating film formed from selected materials is inhibited so as to cause deterioration of device characteristics.

Furthermore, in the method in which the self-organized layer of OTS or the like is formed on the surface of the gate insulating film, the self-organized layer is not easily formed on the surface of the source electrode and the drain electrode formed from, for example, gold (Au) having good electrical conductivity. Consequently, it is difficult to make the surface state of the source electrode and the drain electrode completely equal to the surface state of the substrate and the gate insulating film. Therefore, it is difficult to grow the organic semiconductor thin film on the source electrode and the drain electrode in the same manner as that on the substrate and the gate insulating film. This causes deterioration of the device characteristics of the organic TFT due to an increase in contact resistance.

Accordingly, it is desirable to provide a thin film transistor, wherein a semiconductor thin film having good, uniform film quality can be disposed on exposed surfaces of a substrate and a gate insulating film and exposed surfaces of a source electrode and a drain electrode and, thereby, characteristics are improved, for example, the contact resistance between the semiconductor thin film and the source electrode and the drain electrode is reduced, a method for manufacturing such a thin film transistor, and an electronic apparatus including the thin film transistor.

A thin film transistor according to an embodiment includes an insulating layer formed from an organic material, an oxide material, or a silicon based material, a source electrode and a drain electrode disposed on the insulating layer by using an electrically conductive oxide material, a self-organized film covering exposed surfaces of the insulating layer, the source electrode, and the drain electrode, and a semiconductor thin film disposed, on the insulating layer provided with the self-organized film, over from the source electrode to the drain electrode.

A method for manufacturing a thin film transistor, according to an embodiment, includes the steps of forming a source electrode and a drain electrode by using an electrically conductive oxide material on an insulating layer formed from an organic material, an oxide material, or a silicon based material, forming a self-organized film on exposed surfaces of the insulating layer, the source electrode, and the drain electrode through a surface treatment, and forming a semiconductor thin film, on the insulating layer provided with the self-organized film, over from the source electrode to the drain electrode.

An electronic apparatus according to an embodiment has a thin film transistor including an insulating layer formed from an organic material, an oxide material, or a silicon based material, a source electrode and a drain electrode disposed on the insulating layer by using an electrically conductive oxide material, a self-organized film covering exposed surfaces of the insulating layer, the source electrode, and the drain electrode, and a semiconductor thin film disposed, on the insulating layer provided with the self-organized film, over from the source electrode to the drain electrode.

In the above-described configuration, the same self-organized film can be formed on the exposed surface of the insulating layer formed from the organic material, the oxide material, or the silicon based material and the exposed surfaces of the electrically conductive oxide material constituting the source electrode and the drain electrode. Consequently, a base material of the semiconductor thin film disposed over from the source electrode to the drain electrode is reformed by the same self-organized film uniformly.

As described above, according to an embodiment, the base material of the semiconductor thin film disposed over from the source electrode to the drain electrode can be reformed by the same self-organized film uniformly. Consequently, the semiconductor thin film having good, uniform film quality can be disposed on exposed surfaces of the substrate and the gate insulating film and exposed surfaces of the source electrode and the drain electrode. Therefore, the contact resistance between the semiconductor thin film and the source electrode and the drain electrode can be reduced and characteristics can be improved in the thin film transistor including the semiconductor thin film. In addition, the characteristics of an electronic apparatus configured to include the thin film transistor can be improved.

Additional features and advantages are described herein, and will be apparent from the following Detailed Description and the figures.

DETAILED DESCRIPTION

The individual embodiments, to which the present application is applied, will be described below with reference to the drawings. In this regard, in each embodiment, the explanation is made in the order of the configuration of a thin film transistor and a method for manufacturing the thin film transistor. Thereafter, an embodiment of a display device as an electronic apparatus including the thin film transistor will be explained.

Configuration of Thin Film Transistor of First Embodiment

Figure 1:
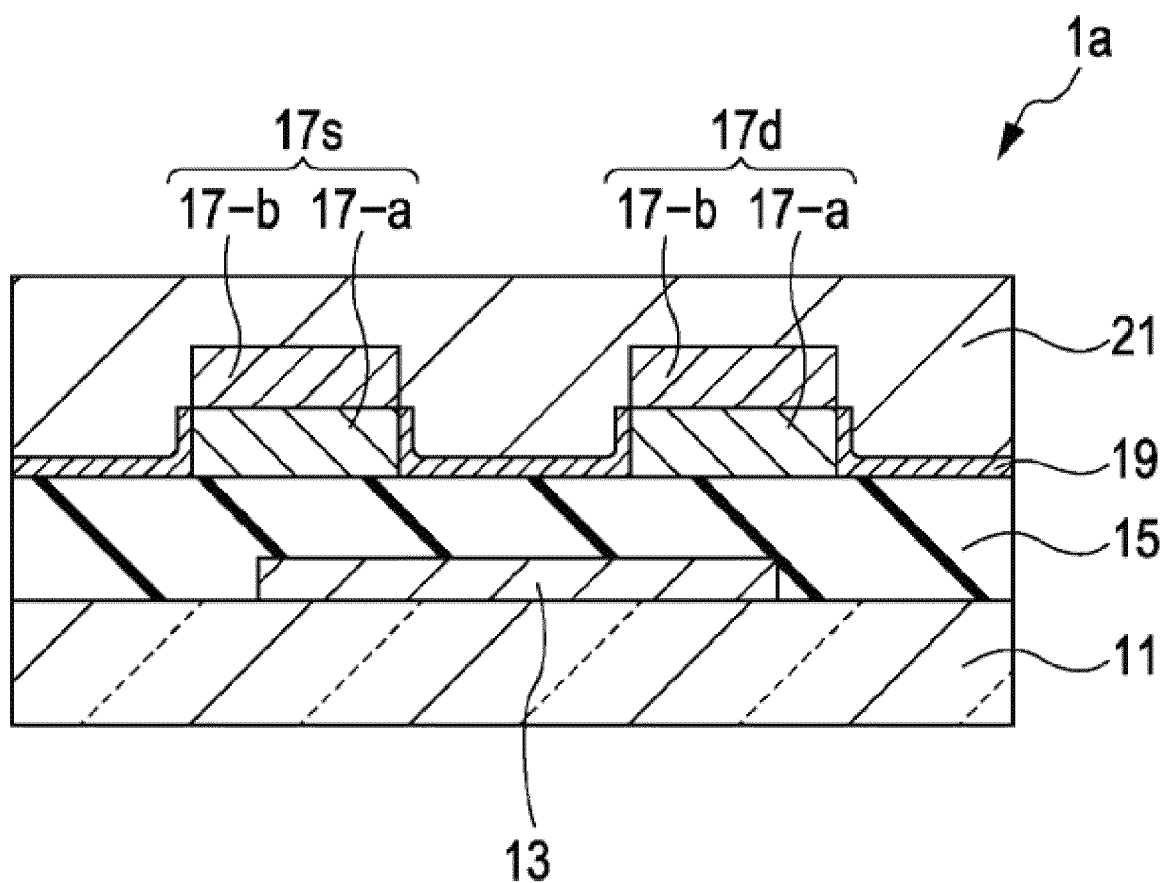
FIG. 1 is a sectional view of a thin film transistor according to a first embodiment.

FIG. 1 is a sectional view of a thin film transistor according to a first embodiment. A thin film transistor 1a shown in FIG. 1 has a configuration of a bottom gate-bottom contact type thin film transistor and includes a gate electrode 13, a gate insulating film 15, a source electrode 17s and a drain electrode 17d, a self-organized film 19, and a semiconductor thin film 21 in that order from the substrate 11 side.

In this regard, it is particularly characteristic that the source electrode 17s and the drain electrode 17d are formed by using an electrically conductive oxide material and the self-organized film 19 is disposed while covering the exposed surfaces of the gate insulating film 15, the source electrode 17s, and the drain electrode 17d. The configuration of the thin film transistor 1a will be described below sequentially from the substrate 11 side.

The substrate 11 is formed from, for example, a glass substrate and it is desirable that at least the surface side is formed from an insulating material. Besides this, examples of materials for the substrate 11 include plastic sheets of polyethylene terephthalate (PET), polyether sulfone (PES), polyethylene naphthalate (PEN), polycarbonate (PC), and liquid crystal polymer. Furthermore, metal sheets of stainless steel, aluminum, copper, and the like having surfaces subjected to an insulation treatment may be used for the substrate 11.

The gate electrode 13 disposed on the substrate 11 is formed from, for example, aluminum (Al). Furthermore, the gate electrode 13 may be formed through patterning of a metal material film formed from tungsten (W), tantalum (Ta), molybdenum (Mo), gold (Au), chromium (Cr), titanium (Ti), copper (Cu), nickel (Ni), or the like besides aluminum (Al) by a sputtering method, an evaporation method, or a plating method. Alternatively, the gate electrode 13 may be formed through patterning on the basis of printing technology, e.g., ink-jet printing, screen printing, offset printing, or gravure printing, by using an ink paste containing gold (Au) fine particles, silver (Ag) fine particles, or the like.

The gate insulating film 15 is formed as an insulating layer serving as a base material of a self-organized film described below and is formed from an organic material, an oxide material, or a silicon based material. It is preferable that the gate insulating film 15 is formed from a material capable of being made into a coating film, for example, polyvinyl phenol.

Besides polyvinyl phenol, organic materials, e.g., polyimides, polymethyl methacrylates, polyvinyl alcohols, polyparaxylylenes, polyesters, polyethylenes, polycarbonates, polyamides, polyamide imides, polyether imides, polysiloxanes, polymethacrylic amides, polyurethanes, polybutadienes, polystyrenes, polyvinyl chlorides, nitrile rubber, acrylic rubber, butyl rubber, epoxy resins, phenol resins, melamine resins, urea resins, and novolac resins, are used for the gate insulating film (insulating layer) 15. The organic material may be a fluororesin, e.g., CYTOP (registered trade mark).

Furthermore, the gate insulating film (insulating layer) 15 may be formed from a silicon based material, e.g., silicon nitride, silicon oxide, or silicon carbide, or an oxide material, e.g., aluminum oxide, tantalum oxide, or hafnium oxide besides the above-described organic material.

Moreover, the source electrode 17s and the drain electrode 17d disposed on the gate insulating film (insulating layer) 15 are formed by using an electrically conductive oxide material. Here, it is particularly characteristic that the source electrode 17s and the drain electrode 17d are configured to have a laminated structure of an oxide material layer 17-a formed from an electrically conductive oxide material and a metal material layer 17-b disposed thereon.

In this regard, for example, molybdenum oxide, indium-tin oxide (ITO), indium-zinc oxide (IZO), titanium oxide, tin oxide, zinc oxide, niobium oxide, indium oxide, zirconium oxide, lanthanum oxide, strontium titanate, barium titanate, or the like is used for the oxide material layer 17-a formed from the electrically conductive oxide material.

Then, for example, gold (Au), platinum (Pt), palladium (Pd), chromium (Cr), nickel (Ni), molybdenum (Mo), niobium (Nb), neodymium (Nd), rubidium (Rb), rhodium (Rh), aluminum (Al), silver (Ag), tantalum (Ta), tungsten (W), titanium (Ti), copper (Cu), indium (In), tin (Sn), or an alloy thereof is used for the metal material layer 17-b.

The self-organized film 19 is disposed while covering an exposed surface of the gate insulating film 15 and exposed surfaces of the oxide material layers 17-a constituting the source electrode 17s and the drain electrode 17d. In this regard, the oxide material layers 17-a of the source electrode 17s and the drain electrode 17d are disposed immediately above the gate insulating film 15. Consequently, the self-organized film 19 covering the exposed surface of the gate insulating film 15 and the self-organized film 19 covering the exposed surfaces of the oxide material layers 17-a become the same film disposed seamlessly.

In this regard, as is explained in the manufacturing method described below, the self-organized film 19 is a film formed while molecules are arranged through self organization on a surface of a specific material by conducting a surface treatment. In particular, the seamless self-organized film 19 is disposed on the exposed surface of the oxide material layers 17-a constituting the source electrode 17s and the drain electrode 17d and the exposed surface of the gate insulating film 15 formed from the organic material, the oxide material, or the silicon based material by the same surface treatment. The above-described self-organized film 19 is formed from a silane coupling agent containing, for example, a silane compound.

Specific examples of silane coupling agents include octadecyltrichlorosilane. Besides this, a compound having an ethoxy (or methoxy) group, which gives a silanol group (Si—OH) through hydrolysis, at one end of the molecule may be used as the silane coupling agent.

Furthermore, the semiconductor thin film 21 is disposed over from the source electrode 17s to the drain electrode 17d. This semiconductor thin film 21 is disposed adhering to the source electrode 17s and the drain electrode 17d, which are disposed oppositely, and the gate insulating film 15 between these source electrode 17s and drain electrode 17d with the self-organized film 19 therebetween. In this regard, the semiconductor thin film 21 may be formed directly on the exposed surfaces of the metal material layers 17-b of the source electrode 17s and the drain electrode 17d.

The above-described semiconductor thin film 21 is formed from an organic semiconductor material, e.g., pentacene, naphthacene, hexacene, heptacene, pyrene, chrysene, perylene, coronene, rubrene, polythiophene, polyacene, polyphenylene vinylene, polypyrrole, porphyrin, carbon nanotube, fullerene, metal phthalocyanine, or a derivative thereof.

Alternatively, an oxide semiconductor, e.g., $InGaZnO_4$ or ZnO, may be used for the semiconductor thin film 21.

Method for Manufacturing Thin Film Transistor of First Embodiment

FIGS. 2A to 2E are sectional step diagrams showing an example of a procedure for manufacturing the thin film transistor having the above-described configuration. A method for manufacturing a thin film transistor 1a of the first embodiment will be described below with reference to these sectional step diagrams.

Figure 2A:
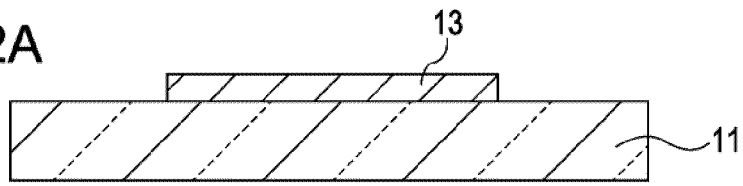
FIGS. 2A to 2E are sectional step diagrams showing a method for manufacturing the thin film transistor according to the first embodiment.

Initially, as shown in FIG. 2A, the gate insulating film 13 is formed on the substrate 11 through patterning. Here, for example, an aluminum film is formed on a glass substrate 11. Thereafter, the aluminum film is patterned by wet etching while a resist pattern is used as a mask, so that the gate electrode 13 is formed from aluminum through patterning.

Figure 2B:
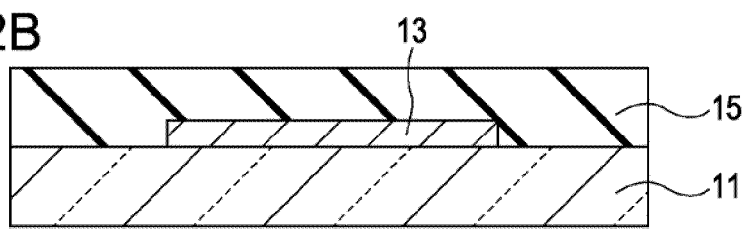

Next, as shown in FIG. 2B, the gate insulating film 15 is formed on the substrate 11 provided with the gate electrode 13. Here, for example, a polyvinyl phenol solution is subjected to spin coating on the substrate 11 provided with the gate electrode 13, and heat-drying is conducted, so that the gate insulating film (insulating layer) 15 is formed from an organic material while covering the gate electrode 13. In this regard, the film formation of the gate insulating film 15 is conducted by a film formation method selected appropriately on the basis of the material used as the gate insulating film.

Figure 2C:
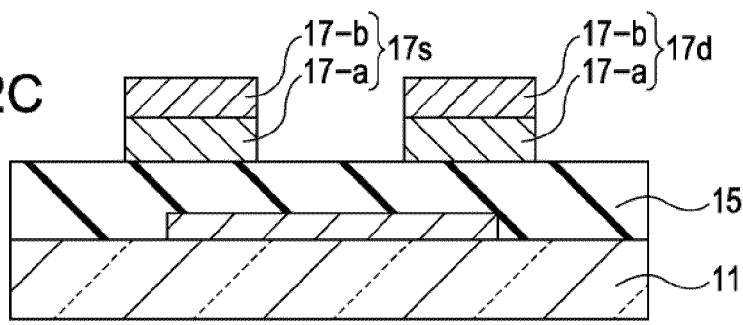

Subsequently, as shown in FIG. 2C, the source electrode 17s and the drain electrode 17d, which have a laminated structure of the oxide material layer 17-a and the metal material layer 17-b, are formed on the gate insulating film 15. Here, the source electrode 17s and the drain electrode 17d are formed by applying, for example, a lift-off method. At this time, a resist pattern is formed on the gate insulating film 15, a molybdenum oxide film and a Au film are formed thereon in that order and, thereafter, the resist pattern is removed. Consequently, the molybdenum oxide film and the Au film on the resist pattern are removed through lift-off, and the source electrode 17s and the drain electrode 17d are formed from laminated portions of the oxide material layer 17-a formed from the molybdenum oxide film and the metal material layer 17-b formed from the Au film, which are left on the gate insulating film 15.

Figure 2D:
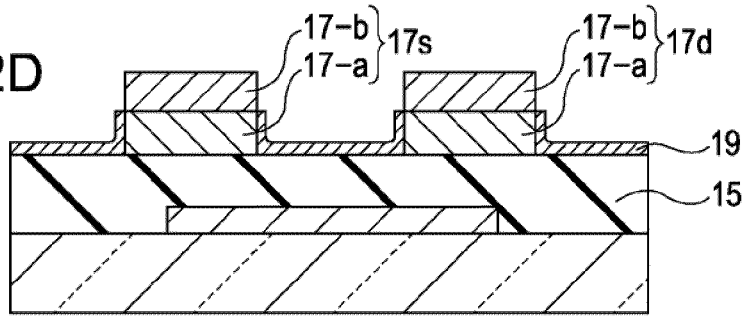

Then, as shown in FIG. 2D, the self-organized film 19 is formed on the exposed surfaces of the gate insulating film 15 and the oxide material layers 17-a of the source electrode 17s and the drain electrode 17d. Here, the substrate 11 provided with the source electrode 17s and the drain electrode 17d is subjected to a surface treatment by being immersed in, for example, an octadecyltrichlorosilane solution serving as a silane coupling agent. In this manner, the self-organized film 19 composed of the silane coupling agent is formed seamlessly on the exposed surface of the gate insulating film (insulating layer) 15 formed from the organic material and the exposed surfaces of the oxide material layers 17-a of the source electrode 17s and the drain electrode 17d.

Figure 2E:
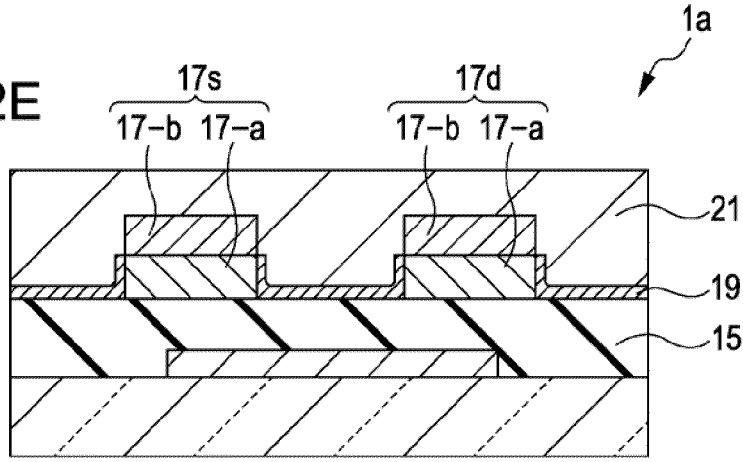

In this state, as shown in FIG. 2E, the semiconductor thin film 21 is formed over from the source electrode 17s to the drain electrode 17d. Here, the semiconductor thin film 21 is formed from pentacene through evaporation by, for example, a resistance heating method. In this regard, as for the method for forming the semiconductor thin film 21, an appropriate film formation method, e.g., a coating method or a printing method, is selected in accordance with a material to be used.

In this manner, the bottom gate-bottom contact type thin film transistor 1a is obtained, which has the configuration explained with reference to FIG. 1.

In the above-described first embodiment, the source electrode 17s and the drain electrode 17d including the oxide material layer 17-a serving as the lower layer portion formed from the electrically conductive oxide material are disposed on the gate insulating film 15 formed from the organic material, the oxide material, or the silicon based material. Consequently, the same self-organized film 19 can be disposed on the exposed surface of the gate insulating film 15 and the exposed side wall surfaces of the lower layer portions of the source electrode 17s and the drain electrode 17d. Accordingly, the base material of the semiconductor thin film 21 disposed over from the source electrode 17s to the drain electrode 17d can be reformed by the same self-organized film 19 uniformly, so that the semiconductor thin film 21 formed thereon can have good, uniform film quality.

As a result, regarding the thin film transistor 1a including the semiconductor thin film 21, the transistor characteristics can be improved, for example, the contact resistance between the semiconductor thin film 21 and the source electrode 17s and the drain electrode 17d is reduced.

Furthermore, the source electrode 17s and the drain electrode 17d have a laminated structure in which the metal material layer 17-b is disposed on the above-described oxide material layer 17-a. Therefore, the electrical conductivity is ensured sufficiently. In this regard, in the formation of the self-organized film 19 by the surface treatment explained with reference to FIG. 2D, the self-organized film 19 is not easily formed on the exposed surface of the metal material layer 17-b. However, the semiconductor thin film 21 having good quality can be grown on the side in contact with the gate insulating film 15 through the self-organized film 19 insofar as the self-organized film 19 is disposed on the gate insulating film 15 and the side wall of the oxide material layer 17-a immediately above the gate insulating film 15.

Configuration of Thin Film Transistor of Second Embodiment

Figure 3:
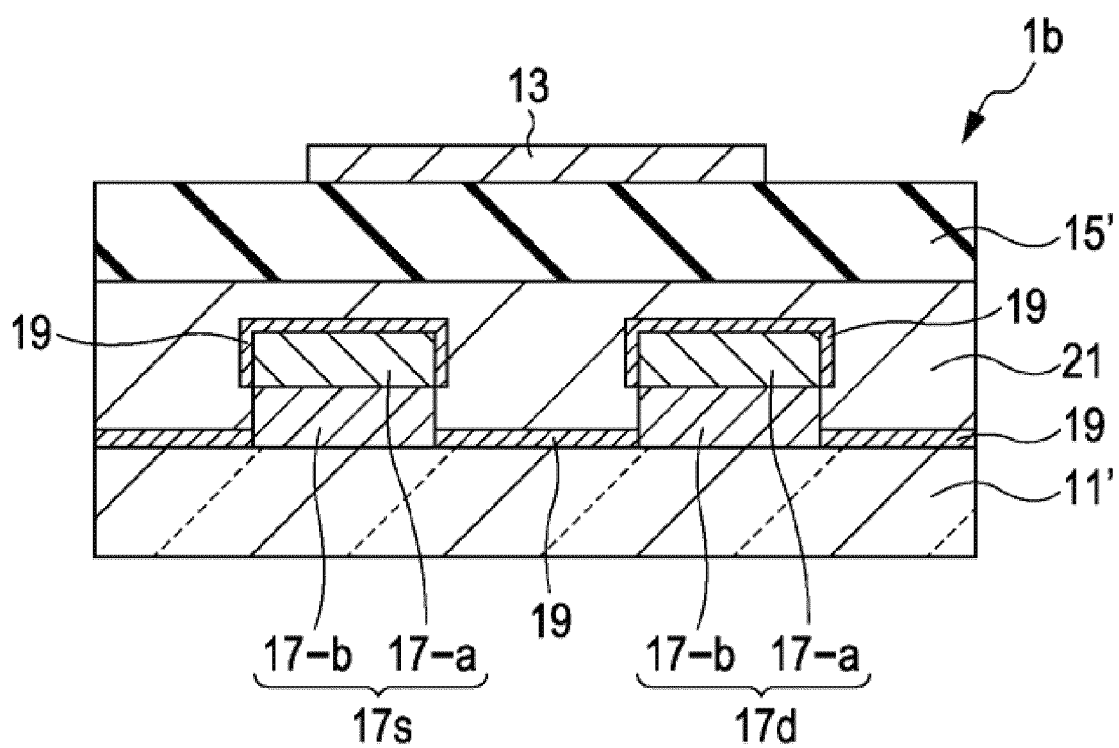
FIG. 3 is a sectional view of a thin film transistor according to a second embodiment.

FIG. 3 is a sectional view of a thin film transistor according to a second embodiment. The same constituent elements as those of the thin film transistor of the first embodiment described with reference to FIG. 1 are indicated by the same reference numerals as those set forth above and the configuration of a thin film transistor 1b of the second embodiment will be described below.

The thin film transistor 1b shown in FIG. 3 has a configuration of a top gate-bottom contact type thin film transistor and includes a source electrode 17s and a drain electrode 17d, self-organized films 19, a semiconductor thin film 21, a gate insulating film 15', and a gate electrode 13 in that order from the substrate 11' side.

In this regard, it is particularly characteristic that the source electrode 17s and the drain electrode 17d are formed by using an electrically conductive oxide material and the self-organized films 19 are disposed while covering the exposed surfaces of the substrate 11', the source electrode 17s, and the drain electrode 17d. The configuration of the thin film transistor 1b will be described below sequentially from the substrate 11' side.

The substrate 11' is formed as an insulating layer serving as a base material of a self-organized film described below and at least the surface side is formed from an organic material, an oxide material, or a silicon based material.

The above-described substrate 11' may has a single structure composed of a glass substrate, a quartz substrate, or a plastic sheet of polyethylene terephthalate (PET), polyether sulfone (PES), polyethylene naphthalate (PEN), polycarbonate (PC), liquid crystal polymer, or the like. Furthermore, the substrate 11' may be used as an insulating layer formed from an organic material, an oxide material, or a silicon based material by subjecting the surface of a metal sheet of stainless steel, aluminum, copper, or the like to an insulation treatment.

The source electrode 17s and the drain electrode 17d disposed on the substrate 11' serving as an insulating layer is formed by using an electrically conductive oxide material. Here, it is particularly characteristic that the source electrode 17s and the drain electrode 17d are configured to have a laminated structure of a metal material layer 17-b and an oxide material layer 17-a formed from an electrically conductive oxide material disposed thereon in a manner contrary to the first embodiment.

Here, as for the oxide material layer 17-a, for example, molybdenum oxide, indium-tin oxide (ITO), indium-zinc oxide (IZO), titanium oxide, tin oxide, zinc oxide, niobium oxide, indium oxide, zirconium oxide, lanthanum oxide, strontium titanate, barium titanate, or the like is used as in the case of the first embodiment.

Then, as for the metal material layer 17-b, for example, gold (Au), platinum (Pt), palladium (Pd), chromium (Cr), nickel (Ni), molybdenum (Mo), niobium (Nb), neodymium (Nd), rubidium (Rb), rhodium (Rh), aluminum (Al), silver (Ag), tantalum (Ta), tungsten (W), titanium (Ti), copper (Cu), indium (In), tin (Sn), or an alloy thereof is used, as in the case of the first embodiment.

The self-organized film 19 is disposed while covering an exposed surface of the substrate 11' and exposed surfaces of the oxide material layers 17-a constituting the source electrode 17s and the drain electrode 17d. In this regard, the oxide material layers 17-a of the source electrode 17s and the drain electrode 17d are disposed on the substrate 11' with the metal material layer 17-b therebetween. Consequently, the self-organized film 19 covering the exposed surface of the substrate 11' and the self-organized film 19 covering the exposed surfaces of the oxide material layers 17-a are formed from the same material but are in the state of being separated at side wall portions of the metal material layers 17-b. Moreover, the upper portions of the source electrode 17s and the drain electrode 17d are formed from the oxide material layers 17-a and, therefore, the upper surfaces of the source electrode 17s and the drain electrode 17d are in the state of being covered with the self-organized films 19.

In this regard, as is explained in the first embodiment, the self-organized film 19 is a film formed while molecules are arranged through self organization on a surface of a specific material by conducting a surface treatment. In particular, the same self-organized film 19 is formed here on the exposed surface of the oxide material layers 17-a constituting the source electrode 17s and the drain electrode 17d and the exposed surface of the substrate 11' formed from the organic material, the oxide material, or the silicon based material by the same surface treatment. The above-described self-organized film 19 is formed from a silane coupling agent containing, for example, a silane compound.

Specific examples of silane coupling agents include octadecyltrichlorosilane as in the case of the first embodiment. Besides this, a compound having an ethoxy (or methoxy) group, which gives a silanol group (Si—OH) through hydrolysis, at one end of the molecule may be used as the silane coupling agent.

Furthermore, the semiconductor thin film 21 is disposed over from the source electrode 17s to the drain electrode 17d. This semiconductor thin film 21 is disposed adhering to the source electrode 17s and the drain electrode 17d, which are disposed oppositely, and the substrate 11' between these source electrode 17s and drain electrode 17d with the self-organized films 19 therebetween. In this regard, the semiconductor thin film 21 may be formed directly on the exposed surfaces of the metal material layers 17-b of the source electrode 17s and the drain electrode 17d.

The above-described semiconductor thin film 21 is formed from an organic semiconductor material, e.g., pentacene, naphthacene, hexacene, heptacene, pyrene, chrysene, perylene, coronene, rubrene, polythiophene, polyacene, polyphenylene vinylene, polypyrrole, porphyrin, carbon nanotube, fullerene, metal phthalocyanine, or a derivative thereof. Alternatively, an oxide semiconductor, e.g., $InGaZnO_4$ or ZnO, may be used for the semiconductor thin film 21.

As for the gate insulating film 15', it is preferable that a material suitable for a gate insulating film is selected and used. For example, polyparaxylylenes are used. Besides polyparaxylylenes, polyimides, polymethyl methacrylates, polyvinyl alcohols, polyvinyl phenols, polyesters, polyethylenes, polycarbonates, polyamides, polyamide imides, polyether imides, polysiloxanes, polymethacrylic amides, polyurethanes, polybutadienes, polystyrenes, polyvinyl chlorides, nitrile rubber, acrylic rubber, butyl rubber, epoxy resins, phenol resins, melamine resins, urea resins, novolac resins, silicon nitride, silicon oxide, silicon carbide, aluminum oxide, tantalum oxide, hafnium oxide, CYTOP (registered trade mark), or the like may be used for the above-described gate insulating film 15'.

The gate electrode 13 disposed on the gate insulating film 15' is formed from, for example, gold (Au). Furthermore, the gate electrode 13 may be formed through patterning of a metal material film formed from tungsten (W), tantalum (Ta), molybdenum (Mo), aluminum (Al), chromium (Cr), titanium (Ti), copper (Cu), nickel (Ni), or the like besides gold (Au) by a sputtering method, an evaporation method, or a plating method. Alternatively, the gate electrode 13 may be formed through patterning on the basis of printing technology, e.g., ink-jet printing, screen printing, offset printing, or gravure printing, by using an ink paste containing gold (Au) fine particles, silver (Ag) fine particles, or the like.

Method for Manufacturing Thin Film Transistor of Second Embodiment

FIGS. 4A to 4E are sectional step diagrams showing an example of a procedure for manufacturing the thin film transistor having the above-described configuration. A method for manufacturing a thin film transistor 1b of the second embodiment will be described below with reference to these sectional step diagrams.

Figure 4A:
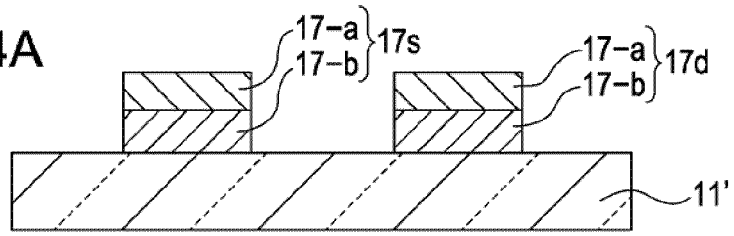
FIGS. 4A to 4E are sectional step diagrams showing a method for manufacturing the thin film transistor according to the second embodiment.

Initially, as shown in FIG. 4A, the source electrode 17s and the drain electrode 17d, which have a laminated structure of the metal material layer 17-b and the oxide material layer 17-a, are formed on the substrate 11'. Here, the source electrode 17s and the drain electrode 17d are formed by applying, for example, a lift-off method. At this time, a resist pattern is formed on a glass substrate 11', a Au film and a molybdenum oxide film are formed thereon in that order and, thereafter, the resist pattern is removed. Consequently, the Au film and the molybdenum oxide film on the resist pattern are removed through lift-off, and the source electrode 17s and the drain electrode 17d are formed from laminated portions of the metal material layer 17-b formed from the Au film and the oxide material layer 17-a formed from the molybdenum oxide film, which are left on the substrate 11'.

Figure 4B:
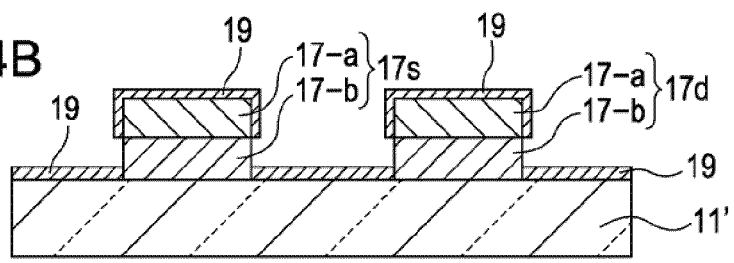

Then, as shown in FIG. 4B, the self-organized film 19 is formed on the exposed surfaces of the substrate 11' and the oxide material layers 17-a of the source electrode 17s and the drain electrode 17d. Here, the substrate 11' provided with the source electrode 17s and the drain electrode 17d is subjected to a surface treatment by being immersed in an octadecyltrichlorosilane solution serving as a silane coupling agent. In this manner, the self-organized films 19 composed of the silane coupling agent are formed on the exposed surface of the substrate 11' formed from the glass material containing silicon and the exposed surfaces of the oxide material layers 17-a of the source electrode 17s and the drain electrode 17d.

In this regard, besides octadecyltrichlorosilane, a compound (so-called silane coupling agent) having an ethoxy (or methoxy) group, which gives a silanol group (Si—OH) through hydrolysis, at one end of the molecule may be used for the surface treatment to form the self-organized film 19.

Figure 4C:
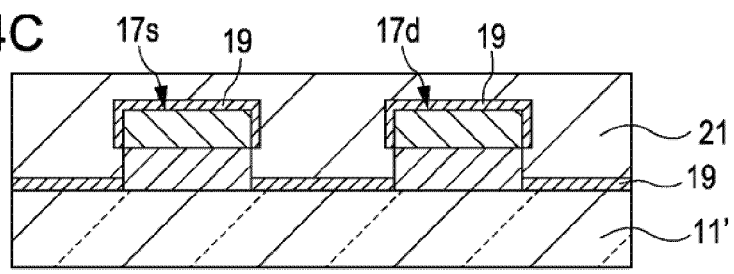

As shown in FIG. 4C, the semiconductor thin film 21 is formed over from the source electrode 17s to the drain electrode 17d. Here, the semiconductor thin film 21 is formed from pentacene through evaporation by, for example, a resistance heating method. In this regard, as for the method for forming the semiconductor thin film 21, an appropriate film formation method, e.g., a coating method or a printing method, is selected in accordance with a material to be used.

Figure 4D:
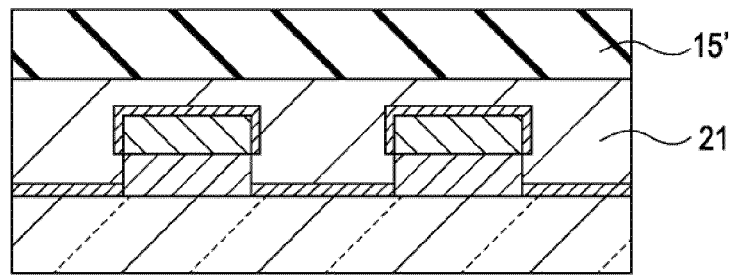

As shown in FIG. 4D, the gate insulating film 15' is formed on the semiconductor thin film 21. Here, for example, the gate insulating film 15' is formed from a polyparaxylylene on the semiconductor thin film 21 through CVD.

Figure 4E:
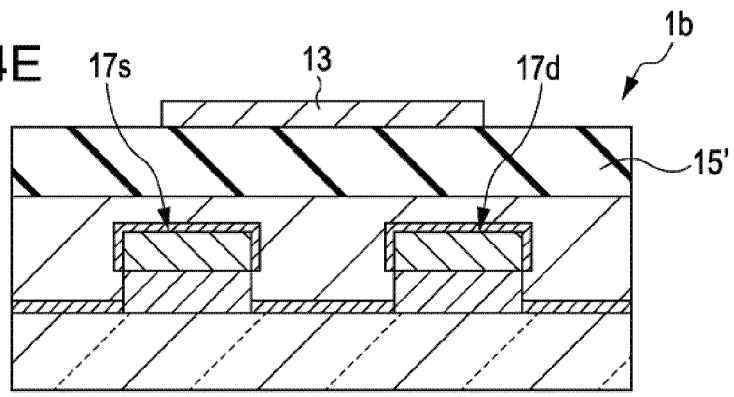

As shown in FIG. 4E, the gate insulating film 13 is formed on the gate insulating film 15' through patterning. Here, for example, a gold (Au) film is formed on the gate insulating film 15' formed from polyparaxylylene. Thereafter, the gold (Au) film is patterned by wet etching while a resist pattern is used as a mask, so that the gate electrode 13 is formed from gold (Au) through patterning.

In this manner, the top gate-bottom contact type thin film transistor 1b is obtained, which has the configuration explained with reference to FIG. 3.

In the above-described second embodiment, the source electrode 17s and the drain electrode 17d including the oxide material layer 17-a serving as the upper layer portion formed from the electrically conductive oxide material are disposed on the substrate 11' formed from the organic material, the oxide material, or the silicon based material. Consequently, the same self-organized film 19 can be disposed on the exposed surface of the substrate 11' and the upper surfaces and the exposed side wall surfaces of the upper layer portions of the source electrode 17s and the drain electrode 17d. Accordingly, the base material of the semiconductor thin film 21 disposed over from the source electrode 17s to the drain electrode 17d can be reformed by the same self-organized film 19 uniformly, so that the semiconductor thin film 21 formed thereon can have good, uniform film quality.

As a result, regarding the thin film transistor 1b including the semiconductor thin film 21, the transistor characteristics can be improved, for example, the contact resistance between the semiconductor thin film 21 and the source electrode 17s and the drain electrode 17d is reduced.

Furthermore, the source electrode 17s and the drain electrode 17d have a laminated structure in which the metal material layer 17-b is disposed under the above-described oxide material layer 17-a. Therefore, the electrical conductivity is ensured sufficiently. In this regard, in the formation of the self-organized film 19 by the surface treatment explained with reference to FIG. 4B, the self-organized film 19 is not easily formed on the exposed surface of the metal material layer 17-b. However, the semiconductor thin film 21 having good quality can be grown on the side in contact with the gate insulating film 15' through the self-organized film 19 insofar as the self-organized film 19 is disposed at a location opposite to the gate insulating film 15', and growing can be conducted while the semiconductor thin film 21 at the interface portion to the gate insulating film 15' has good film quality.

Electronic Apparatus

Figure 5:
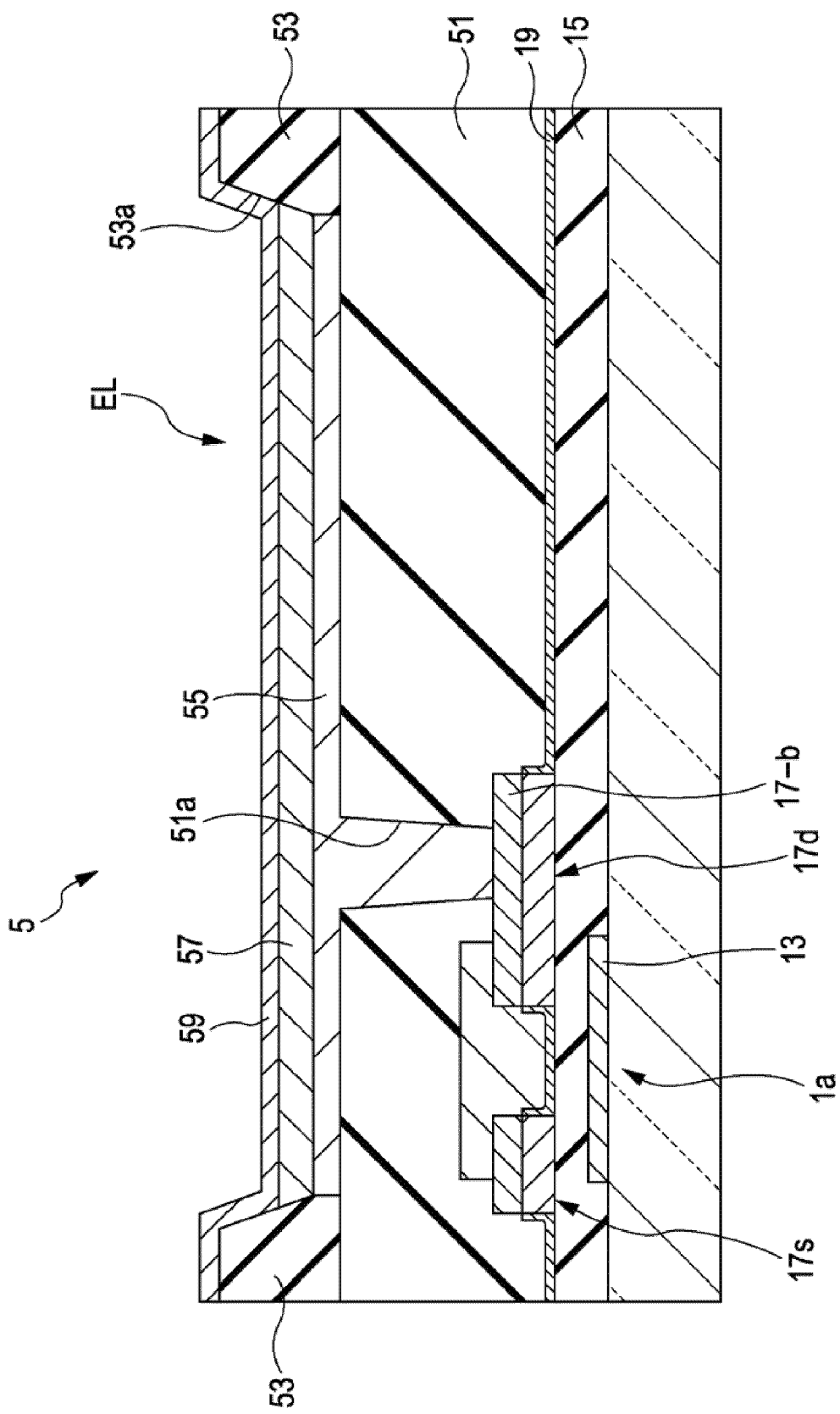
FIG. 5 is a sectional view showing an example of a display device as an electronic apparatus according to an embodiment.

FIG. 5 is a sectional view showing one pixel of an active matrix type display device, which includes an organic electroluminescent element EL, as an example of an electronic apparatus according to an embodiment and including the thin film transistor 1a having the bottom gate-bottom contact structure of the first embodiment, as shown in FIG. 1.

A display device 5 shown in FIG. 5 is the display device provided with the organic electroluminescent element EL and has the following configuration.

That is, the thin film transistor 1a is covered with, for example, an interlayer insulating film 51 with a protective film, although not shown in the drawing, therebetween. It is preferable that this interlayer insulating film 51 is configured to serve as a planarizing film. Furthermore, a connection hole 51a reaching a drain electrode 17d of the thin film transistor 1a is disposed in the interlayer insulating film 51.

Then, each pixel on the interlayer insulating film 51 is provided with an organic electroluminescent element EL connected to the thin film transistor 1a through the connection hole 51a. This organic electroluminescent element EL is element-isolated with an insulating pattern 53 disposed on the interlayer insulating film 51.

This organic electroluminescent element EL includes a pixel electrode 55 disposed on the interlayer insulating film 51. This pixel electrode 55 is formed as an electrically conductive pattern on a pixel basis and is connected to a metal material layer 17-b of the drain electrode 17d of the thin film transistor 1a through the connection hole 51a disposed in the interlayer insulating film 51. The above-described pixel electrode 55 is used as, for example, a positive electrode and is configured to have a light-reflective property.

Furthermore, the peripheral edge of the pixel electrode 55 is covered with the insulating pattern 53 to element-separate the organic electroluminescent element EL. This insulating pattern 53 is provided with an open window 53a to expose the pixel electrode 55 widely, and this open window 53a serves as a pixel opening of the organic electroluminescent element EL. The above-described insulating pattern 53 is formed by using, for example, a photosensitive resin and is patterned by application of a lithography method.

In addition, an organic layer 57 is disposed while covering the pixel electrode 55 exposed at the above-described insulating pattern 53. This organic layer 57 has a laminated structure including at least an organic light-emitting layer and is formed by laminating, as necessary, a hole injection layer, a hole transport layer, an organic light-emitting layer, an electron transport layer, an electron injection layer, and other layers in that order from the positive electrode (here, pixel electrode 55) side. Moreover, for example, the organic layer 57 is formed through patterning on a wavelength of the light emitted from an organic electroluminescent element EL basis, and at least the configuration of a layer containing the organic light-emitting layer is changed on a pixel basis. Furthermore, a layer common to pixels having their respective wavelengths may be included. In addition, in the case where this organic electroluminescent element EL is configured to have a fine resonator structure, the film thicknesses of the organic layers 57 may be adjusted in accordance with the wavelengths of light emitted from the individual organic electroluminescent elements EL.

A common electrode 59 is disposed in such a way as to cover the above-described organic layer 57 while the organic layer 57 is held between the pixel electrode 55 and the common electrode 59. This common electrode 59 is the electrode on the side of taking out of the light h emitted from the organic light-emitting layer of the organic electroluminescent element EL and is formed from a material having the light transmission property. Here, the pixel electrode 55 functions as a positive electrode. Therefore, regarding the common electrode 59, at least the side, which comes into contact with the organic layer 57, is formed from a material, which functions as the negative electrode. In addition, in the case where this organic electroluminescent element EL is configured to have a fine resonator structure, the common electrode 59 is configured to have a transflective property.

Each pixel portion, in which the organic layer 57 is held between the above-described pixel electrode 55 and the common electrode 59, serves as a portion functioning as the organic electroluminescent element EL.

Although not shown in the drawing here, the display device 5 has a configuration in which the side of the surface provided with the individual organic electroluminescent elements EL is covered with a seal resin formed from a light-transmission material and, furthermore, is bonded to a counter substrate formed from the light-transmission material with the above-described seal resin therebetween.

Figure 6:
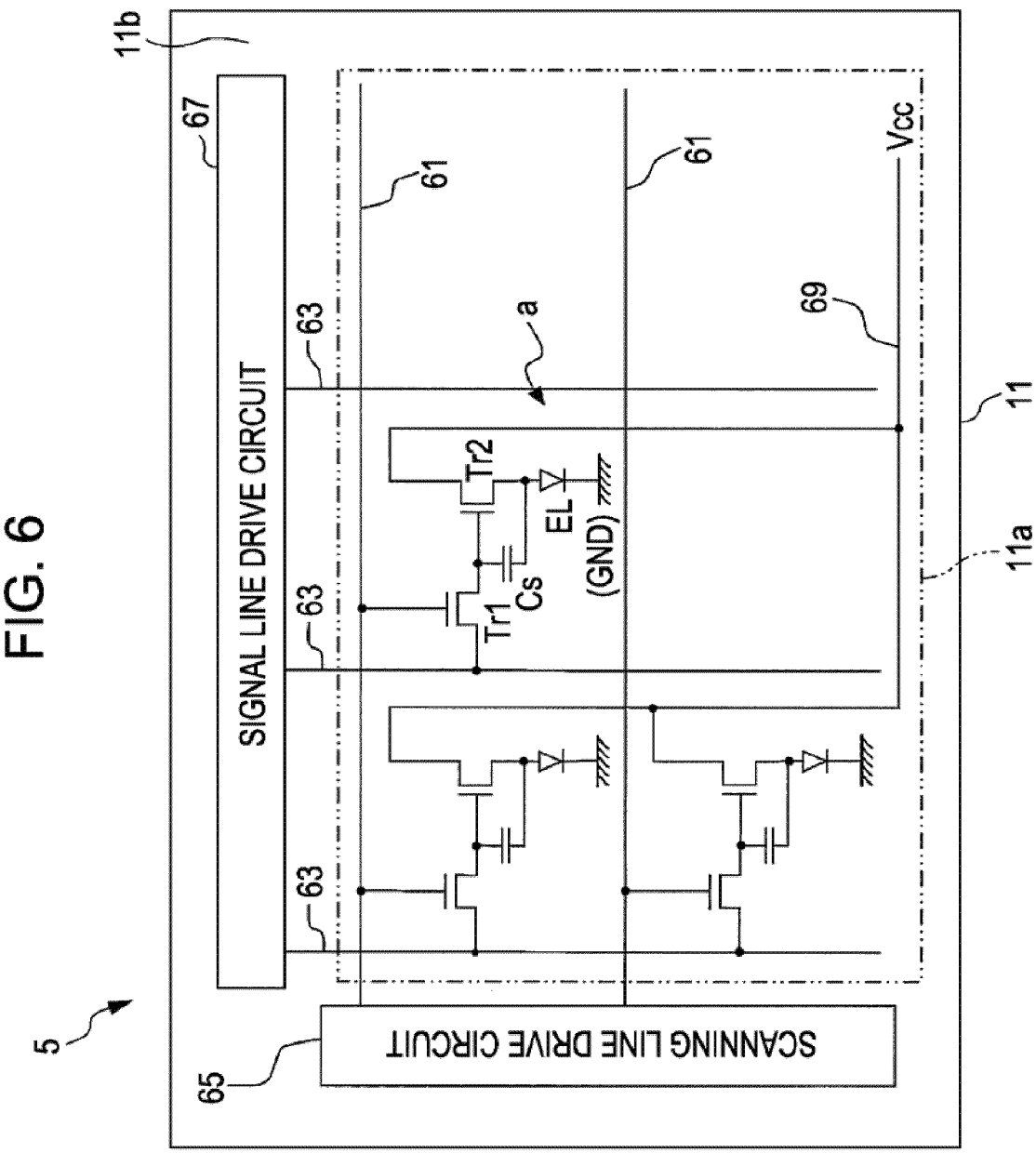
FIG. 6 is a circuit configuration diagram of the display device shown in FIG. 5.

Here, in the display device 5, the thin film transistor 1a having the above-described configuration and the organic electroluminescent element EL connected thereto are arranged in each pixel on the surface side of the substrate 11, and the entire circuit configuration is indicated by, for example, a circuit configuration diagram shown in FIG. 6.

As shown in FIG. 6, a display region 11a and a peripheral region 11b thereof are set on the substrate 11 of the display device 5. The display region 11a is configured to serve as an array portion in which a plurality of scanning lines 61 and a plurality of signal lines 63 are arranged horizontally and vertically, and one pixel a is disposed in accordance with each of the individual intersections thereof. Furthermore, in the peripheral region 11b, a scanning line drive circuit 65 to drive the scanning of the scanning lines 61 and a signal line drive circuit 67 to supply image signals (that is, input signals) in accordance with the brightness information to the signal lines 63 are disposed.

The pixel circuit disposed at each of the intersections of the scanning lines 61 and the signal lines 63 includes, for example, a thin film transistor Tr1 for switching, a thin film transistor Tr2 for driving, a retention capacity Cs, and an organic electroluminescent element EL. The thin film transistor 1a having the configuration explained in the first embodiment is applied to the thin film transistors Tr1 and Tr2 among them.

Then, the image signal written from the signal line 63 through the thin film transistor Tr1 for switching is stored into the retention capacity Cs by driving of the scanning line drive circuit 65. The current in accordance with the amount of the stored signal is supplied from the thin film transistor Tr2 for driving to the organic electroluminescent element EL, and the organic electroluminescent element EL emits light with brightness in accordance with the current value. In this regard, the thin film transistor Tr2 for driving and the retention capacity Cs are connected to a common power supply line (Vcc) 69.

The above-described sectional view shown in FIG. 5 indicates the cross-section of the portion in which the thin film transistor Tr2 and the organic electroluminescent element EL are laminated in the above-described pixel circuit. The thin film transistor Tr1 shown in the pixel circuit is formed by using the same layer as that of the thin film transistor Tr2. Furthermore, the retention capacity Cs shown in the pixel circuit is formed by laminating the layer portions composed of the gate electrode, the gate insulating film, and the drain electrode of the thin film transistor Tr2. Moreover, the scanning line 61 shown in the pixel circuit is formed by extending the gate electrode 13, and the signal line 63 and the power supply line 69 shown in the pixel circuit are formed having the same layer structure as that of the source electrode 17s and the drain electrode 17d shown in the sectional view by using the same layer.

The above-described configuration of the pixel circuit is no more than an example. If necessary, a capacity element may be disposed in the pixel circuit and, furthermore, the pixel circuit may be configured to include a plurality of transistors. In addition, a necessary circuit may be added in the peripheral region 11b in accordance with changes in the pixel circuit.

According to the display device 5 having the above-described configuration, since the pixel circuit is formed by using the thin film transistor 1a having good transistor characteristics, the display characteristic can be improved, as explained in the first embodiment. Moreover, the signal line 63 and the power supply line 69 are formed having the same layer structure as that of the source electrode 17s and the drain electrode 17d, which are formed by using the metal material layer 17-b, by using the same layer. Therefore, the electrical conductivity is also good.

Incidentally, in the above-described embodiment, the display device including the thin film transistor 1a having the bottom gate-bottom contact structure in the first embodiment described with reference to FIG. 1 is explained. However, the thin film transistor 1b having the top gate-bottom contact structure in the second embodiment described with reference to FIG. 3 may be applied to the above-described display device, and substantially the same effects can be obtained. Furthermore, in the above-described embodiment, the active matrix type display device including the organic electroluminescent element EL is shown as an example of electronic apparatuses including the thin film transistors. However, the electronic apparatus according to an embodiment can be widely applied to electronic apparatuses incorporated with thin film transistors. For example, as for the display device, it is possible to apply to flexible displays, e.g., liquid crystal displays. Besides the display devices, it is possible to apply to electronic apparatuses, e.g., ID tags and sensors, and substantially the same effects can be obtained.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A thin film transistor comprising:
an insulating layer formed from an organic material, an oxide material, or a silicon based material;
a source electrode and a drain electrode disposed on the insulating layer, each of the source electrode and drain electrode including an oxide material layer including an electrically conductive oxide material;
a self-organized film covering exposed surfaces of the insulating layer, and exposed surfaces of the oxide material layers of the source electrode and the drain electrode; and
a semiconductor thin film disposed on the self-organized film, the source electrode, and the drain electrode.

2. The thin film transistor according to claim 1,
wherein the source electrode and the drain electrode are formed by laminating a metal material layer on the oxide material layer,
the insulating layer constitutes a gate insulating film,
the self-organized film is disposed so as to cover seamlessly an exposed surface of the gate insulating film and exposed surfaces of the oxide material layers constituting the source electrode and the drain electrode, and
a gate electrode is disposed under the gate insulating film.

3. The thin film transistor according to claim 1,
wherein the source electrode and the drain electrode are formed by laminating the oxide material layer, on a metal material layer,
the self-organized film is disposed so as to cover seamlessly an exposed surface of the insulating layer and exposed surfaces of the oxide material layers constituting the source electrode and the drain electrode, and
a gate electrode is disposed on the semiconductor thin film with a gate insulating film therebetween.

4. The thin film transistor according to claim 1,
wherein the self-organized film is formed from a silane coupling agent.

5. The thin film transistor according to claim 1,
wherein the semiconductor thin film is an organic semiconductor thin film.

6. An electronic apparatus comprising a thin film transistor including:
an insulating layer formed from an organic material, an oxide material, or a silicon based material;
a source electrode and a drain electrode disposed on the insulating layer, each of the source electrode and drain electrode including an oxide material layer including an electrically conductive oxide material;
a self-organized film covering exposed surfaces of the insulating layer, and exposed surfaces of the oxide material layers of the source electrode and the drain electrode; and
a semiconductor thin film disposed on the self-organized film, the source electrode, and the drain electrode.

* * * * *